(12) United States Patent
Scott

(10) Patent No.: US 6,678,202 B2
(45) Date of Patent: Jan. 13, 2004

(54) REDUCED STANDBY POWER MEMORY ARRAY AND METHOD

(75) Inventor: David B. Scott, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 54 days.

(21) Appl. No.: 09/999,361

(22) Filed: Nov. 25, 2001

(65) Prior Publication Data
US 2002/0080676 A1 Jun. 27, 2002

Related U.S. Application Data
(60) Provisional application No. 60/257,768, filed on Dec. 22, 2000.

(51) Int. Cl.[7] .................................................. G11C 8/00
(52) U.S. Cl. ........................ 365/229; 365/154; 327/538
(58) Field of Search .............................. 365/229, 154, 365/156; 323/312; 363/49; 327/538

(56) References Cited

U.S. PATENT DOCUMENTS 5,583,425 A * 12/1996 Rapp et al. ................ 323/316
6,038,183 A * 3/2000 Tsukude ..................... 365/201
6,414,895 B2 * 7/2002 Kokubo et al. ............. 365/227

* cited by examiner

Primary Examiner—Richard Elms
Assistant Examiner—Nam Nguyen
(74) Attorney, Agent, or Firm—Peter K. McLarty; W. James Brady, III; Frederick J. Telecky, Jr.

(57) ABSTRACT

A method is provided for reducing standby power in a memory array including a plurality of transistors. Each of the transistors includes a drain, a source and a gate. The method includes providing a memory array column (30) including a plurality of memory cells (10). Each memory cell (10) includes drive transistors (12). A current limiting transistor (34) is coupled to the drive transistors (12). A mode signal (38) is coupled to the current limiting transistor (34). The mode signal (38) is operable to deactivate the current limiting transistor (34). The current limiting transistor (34) is deactivated when the mode signal (38) indicates that the memory array column (30) is in a standby mode.

27 Claims, 1 Drawing Sheet

REDUCED STANDBY POWER MEMORY ARRAY AND METHOD

This application claims priority under 35 USC §119(e)(1) of provisional application No. 60/257,768 filed Dec. 22, 2000.

TECHNICAL FIELD OF THE INVENTION

This invention relates generally to semiconductor devices and more particularly to a reduced standby power memory array and method.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other components of an integrated circuit.

For memory arrays, the speed associated with read and write operations has become increasingly important. Thus, in order to improve the speed for high performance memory arrays, one technique has been to use low threshold voltage transistors. However, disadvantages associated with using low threshold voltage transistors include an increased leakage current for the circuit while in standby mode.

Previous attempts to solve this leakage problem for a typical six-transistor memory cell have included applying a substrate bias to the N-well of p-channel devices. However, this previous solution is less than optimum as the n-channel devices cannot be subjected to a back gate bias without using a separate deep N-well implant to isolate the substrate contact of the n-channel devices. In addition, a deep N-well results in a layout penalty at the edge of the memory array and gate oxide leakage current remains a problem with this solution.

Another attempt to solve the leakage problem involves the use of high threshold voltage transistors. However, this solution requires the use of an additional mask and fails to eliminate the gate leakage current problem, as well as a degradation in performance due to the cell read current.

SUMMARY OF THE INVENTION

In accordance with the present invention, a reduced standby power memory array and method are provided that substantially eliminate or reduce disadvantages and problems associated with previously developed systems and methods. In particular, the present invention provides a memory array with a reduced memory cell voltage and a back gate bias on the load and drive transistors of the memory cells, resulting in a reduced leakage current during standby mode.

In one embodiment of the present invention, a method is provided for reducing standby power in a memory array including a plurality of transistors. Each of the transistors includes a drain, a source and a gate. The method includes providing a memory array column including a plurality of memory cells. Each memory cell includes drive transistors. A current limiting transistor is coupled to the drive transistors. A mode signal is coupled to the current limiting transistor. The mode signal is operable to deactivate the current limiting transistor. The current limiting transistor is deactivated when the mode signal indicates that the memory array column is in a standby mode.

In another embodiment of the present invention, a reduced standby power memory array is provided that includes a plurality of transistors. Each transistor includes a drain, a source and a gate. The memory array includes a memory cell and a current limiting transistor. The memory cell includes drive transistors. The current limiting transistor is coupled to the drive transistors. The current limiting transistor is operable to receive a mode signal. The mode signal is operable to deactivate the current limiting transistor when the cell is in a standby mode.

Technical advantages of the present invention include providing a reduced standby power memory array. In a particular embodiment, the load and drive transistors of the memory cells in the memory array have a back gate bias and the memory cell voltage is decreased while the memory cells are in a standby mode. However, when the memory cells are in an active mode, the back gate bias is removed and the memory cell voltage returns to a normal level. As a result, the leakage current for the memory cells is reduced during standby mode, without negatively affecting the memory cell in the active mode.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
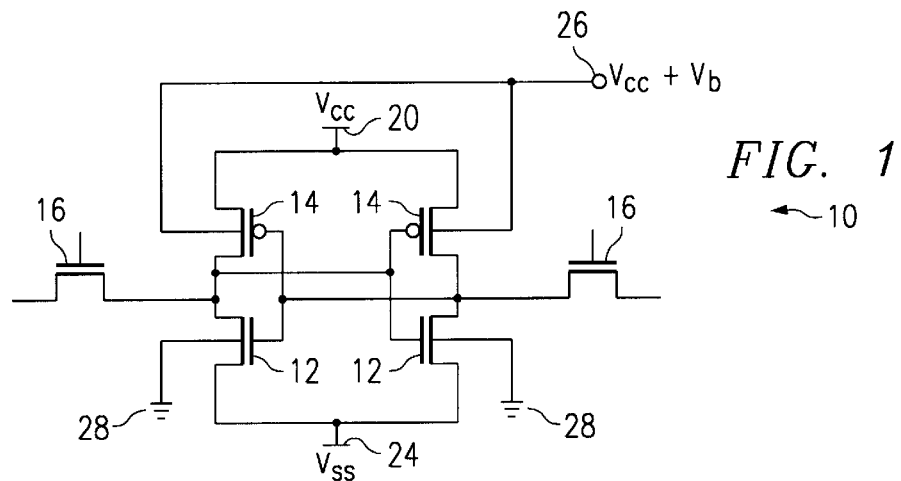
FIG. 1 is a schematic diagram illustrating a memory cell in accordance with one embodiment of the present invention.

FIG. 1 is a schematic diagram illustrating a memory cell 10 in accordance with one embodiment of the present invention. The memory cell 10 comprises a static random access memory (SRAM) cell which may be part of a memory array formed on an integrated circuit. In operation, the memory cell 10 is operable to store data without being externally refreshed as long as power is supplied to the memory cell 10.

The memory cell 10 comprises a plurality of transistors 12, 14 and 16. According to the illustrated embodiment, transistors 12 comprise n-channel, drive transistors, transistors 14 comprise p-channel, load transistors, and transistors 16 comprise n-channel, pass transistors.

The memory cell 10 is operable to store a bit of data and is coupled to a wordline (not shown in FIG. 1) through the gates of the pass transistors 16, to a bitline (not shown in FIG. 1) through one of the pass transistors 16, and to an inverted bitline (not shown in FIG. 1) through the other pass transistor 16. The wordline, bitline, and inverted bitline may be used to select the memory cell 10 for reading the bit of data currently stored in the cell 10 or for writing a bit of data to the cell 10.

The sources of the load transistors 14 are coupled to power supply 20, while the sources of the drive transistors 12 are coupled to power supply 24. The substrates of the load transistors 14 are coupled to power supply 26 which is at a slightly higher potential than power supply 20, while the substrates of the drive transistors are coupled to ground 28.

By providing a potential greater than ground 28, power supply 24 results in a back gate bias for the drive transistors 12. Similarly, by providing a potential greater than the potential of power supply 20, power supply 26 provides a back gate bias for the load transistors 14. In addition, the potential provided by power supplies 24 and 26 results in a decrease in the memory cell voltage. Thus, the leakage current of the memory cell 10 is reduced as a result of the back gate bias and the decreased memory cell voltage.

According to one embodiment, power supplies 20, 24 and 26 each comprise a voltage source that is operable to provide a relatively constant voltage to the memory cell 10. It will be understood, however, that power supplies 20, 24 and 26 may comprise any suitable source of power without departing from the scope of the present invention. It will also be understood that ground 28 comprises any suitable potential that is less than potential of power supplies 20, 24 and 26.

For an exemplary embodiment, power supply 20 provides about 1.2 volts, power supply 24 provides about 0.5 volts while the memory cell 10 is in a standby mode, ground 28 provides a reference voltage of about 0.0 volts, and power supply 26 provides any suitable voltage greater than power supply 20. For example, power supply 26 may provide about 1.7 volts. In addition, power supply 24 is pulled to the same potential as ground 28, or approximately 0.0 volts for the exemplary embodiment, while the memory cell 10 is in an active mode.

In operation, the memory cell 10 may be in a standby mode or an active mode. While in the standby mode, power supply 24 provides a potential greater than ground 28. However, while in the active mode, power supply 24 is pulled to the same potential as ground 28, eliminating the back gate bias and returning the memory cell voltage to a normal level. Thus, leakage current is reduced when the memory cell 10 is in the standby mode, while performance and stability requirements for the memory cell 10 are maintained when the memory cell 10 is in the active mode.

Figure 2:
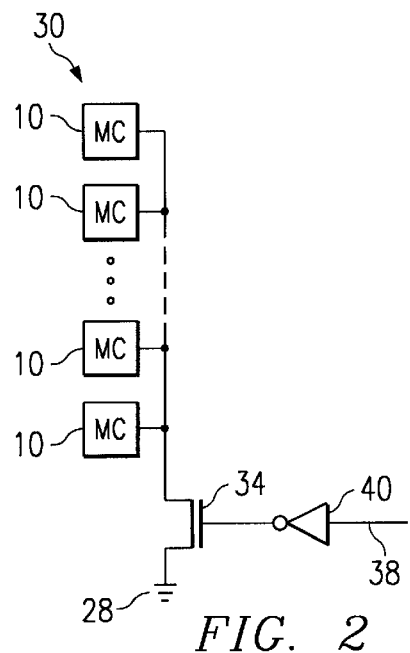
FIG. 2 is a schematic diagram illustrating a memory array column including the memory cell of FIG. 1 in accordance with one embodiment of the present invention.

FIG. 2 is a schematic diagram illustrating a memory array column 30 including memory cells 10 in accordance with one embodiment of the present invention. The memory array column 30 comprises a plurality of memory cells 10 that share a common wordline. According to one embodiment, the memory array column 30 comprises 256 memory cells 10. However, it will be understood that the memory array column 30 may comprise any suitable number of memory cells 10 without departing from the scope of the present invention.

In accordance with the embodiment shown in FIG. 2, power supply 24 is provided through a current limiting transistor 34. According to this embodiment, the current limiting transistor 34 comprises an n-channel transistor. The drain of the current limiting transistor 34 is coupled to the sources of the drive transistors 12 for the memory cells 10 in the memory array column 30. The source of the current limiting transistor 34 is coupled to ground 28.

A mode signal 38 is coupled to the gate of the current limiting transistor 34 through an optional inverter 40. The mode signal 38 is operable to deactivate the current limiting transistor 34 when the mode signal 38 indicates that the memory array column 30 is in the standby mode. The mode signal 38 is also operable to activate the current limiting transistor 34 when the mode signal 38 indicates that the memory array column 30 is in the active mode.

In operation, when the mode signal 38 is high, indicating that the memory array column 30 is in the standby mode, the current limiting transistor 34 is deactivated by the low output from the inverter 40, thereby blocking a path from the drive transistors 12 of the memory cells 10 to ground 28 with the current limiting transistor 34. In this situation, the total leakage current for the memory cells 10 of the memory array column 30 is limited by the leakage current through the current limiting transistor 34.

When the mode signal 38 is low, indicating that the memory array column 30 is in the active mode, the current limiting transistor 34 is activated by the high output from the inverter 40, thereby providing a path from the drive transistors 12 of the memory cells 10 to ground 28 through the current limiting transistor 34. In this way, when the memory array column 30 is in the active mode, power supply 24 is pulled to the same potential as ground 28, thereby allowing performance and stability requirements for the memory cells 10 to be maintained. It will be understood that, without the optional inverter 40, when the mode signal 38 is low the memory array column 30 is in the standby mode, and when the mode signal 38 is high the memory array column 30 is in the active mode.

In accordance with the embodiment illustrated in FIG. 2, the sources of the drive transistors 12 for the memory cells 10 float up until the leakage current through all of the memory cells 10 in the memory array column 30 add up to the leakage current allowed to pass through the current limiting transistor 34 while the memory array column 30 is in the standby mode. Because only one memory cell 10 is in the active mode at any one time, a current limiting transistors 34 with a width of approximately 1 micron, for example, is able to provide the appropriate current for enabling a read operation for the memory cell 10.

In addition, the capacitance on the local source node for the drive transistors 12 is approximately equal to the capacitance of the bitline for the memory cell 10. Thus, capacitance limitations on speed and switching are not negatively affected. DC redundancy is also possible because the memory array column 30 has a limited leakage current through the current limiting transistor 34.

In accordance with one embodiment, the width of the current limiting transistor 34 is designed to be a specified percentage of the total width of the drive transistors 12 for the memory cells 10 in the memory array column 30. This specified percentage corresponds to the desired reduction in leakage current for the memory array column 30. For example, to decrease leakage current for the memory array column 30 by a factor of 10 as compared to a memory array column comprising memory cells with grounded sources for the drive transistors, the current limiting transistor 34 would be designed with a width of approximately one-tenth of the total width of the drive transistors 12 for the memory cells 10 of the memory array column 30.

Because the leakage current is designed for each memory cell 10, there is no need to tailor the technology to specific product requirements. In addition, for each application, the memory cell voltage is set to a value that maximizes SER immunity. The present invention also provides a self-tracking back gate bias over a range of temperatures by allowing the voltage to float to an appropriate level. Thus, the leakage current and the memory cell voltage remain at appropriate levels for the memory cell 10.

Figure 3:
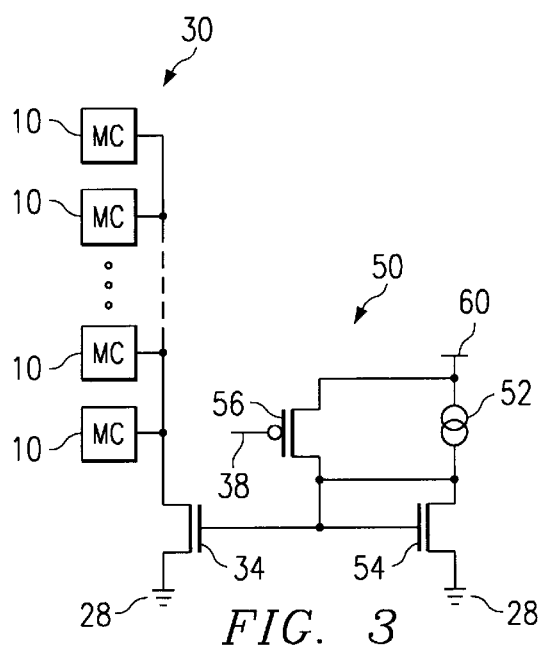
FIG. 3 is a schematic diagram illustrating a memory array column including the memory cell of FIG. 1 in accordance with an alternative embodiment of the present invention.

FIG. 3 is a schematic diagram illustrating a memory array column 30 including memory cells 10 in accordance with an alternative embodiment of the present invention. According to this embodiment, the mode signal 38 is provided to the current limiting transistor 34 through the use of a current mirror 50. It will be understood that the mode signal 38 may be passed through an inverter before being provided to the current mirror 50 based on whether the mode signal 38 is high or low for standby mode.

Thus, power supply 24 comprises a current source 52 for providing a specified leakage current for the memory array column 30, in conjunction with transistors 54 and 56 and a power supply 60. Thus, the current mirror 50 provides the same current through the current limiting transistor 34 as is provided by the current source 52 when the mode signal 38 indicates that the memory array column 30 is in the standby mode. In this way, the leakage current during standby mode is specified by the current source 52.

In accordance with the embodiment illustrated in FIG. 3, the sources of the drive transistors 12 for the memory cells 10 that are coupled to the current limiting transistor 34 are allowed to drift up to a particular voltage corresponding to the leakage current specified by the current source 52 when the memory cells are in the standby mode. When the wordline for the memory array column 30 is activated, the sources of the drive transistors 12 for the memory cells 10 are pulled to ground 28 locally.

Thus, there is no need to lose memory cell voltage in order to provide margins for threshold voltage variations, supply voltage variations, and temperature variations. In addition, with the sources of the drive transistors 12 being pulled to ground 28 locally, excessive peak current and power dissipation are also avoided. In accordance with an alternative embodiment, however, the sources of the drive transistors 12 may be pulled to ground 28 globally.

Figure 4:
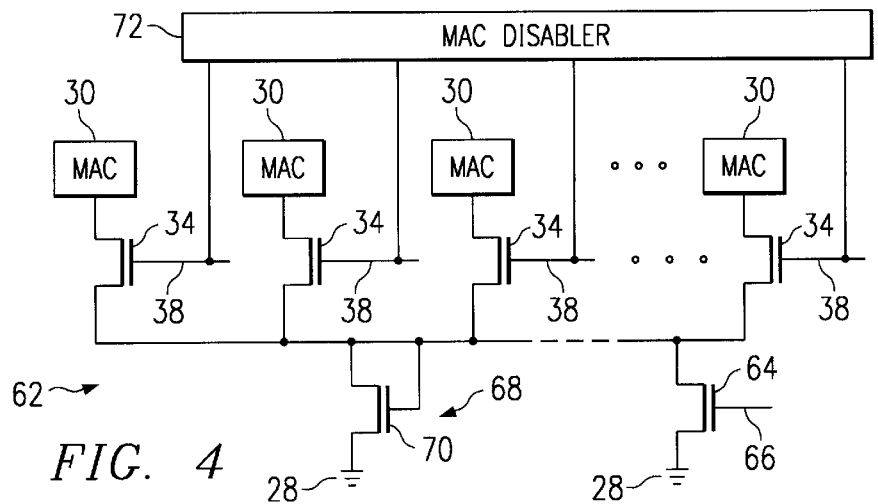
FIG. 4 is a schematic diagram illustrating a memory array including the memory array column of FIGS. 2 and 3 in accordance with one embodiment of the present invention.

FIG. 4 is a schematic diagram illustrating a memory array 62 including memory array columns 30 in accordance with one embodiment of the present invention. According to one embodiment, the memory array 62 comprises 256 memory array columns 30. However, it will be understood that the memory array 62 may comprise any suitable number of memory array columns 30 without departing from the scope of the present invention.

According to this embodiment, each memory array column 30 in the memory array 62 comprises a corresponding column current limiting transistor 34 that may be activated or deactivated by a column mode signal 38 for the corresponding memory array column 30. The memory array 62 also comprises a current limiting transistor 64 for the memory array 62. This array current limiting transistor 64 may be activated or deactivated through an array mode signal 66 for the memory array 62.

Thus, each memory column 30 may be individually activated or deactivated through the column mode signal 38 at the corresponding column current limiting transistor 34. In addition, the memory array columns 30 of the memory array 62 may be activated or deactivated as a group through the array mode signal 66 for the array current limiting transistor 64.

The memory array 62 also comprises an optional clamp 68. The clamp 68 is operable to regulate current through the memory array 62 by preventing the sources of the drive transistors 12 for the memory cells 10 in each memory array column 30 from increasing above a specified potential. According to the embodiment shown in FIG. 4, the clamp 68 comprises a transistor 70 coupled to the memory array columns 30 in a diode configuration.

Thus, when the impedance on the source node is relatively high, such as for memory arrays 62 with low leakage current and for memory arrays 62 operating at low temperatures, the sources of the drive transistors 12 for the memory cells 10 are coupled to ground 28 through the transistor 70 in order to clamp the sources to a fixed voltage above ground 28.

The memory array 62 also comprises a memory array column disabler 72. The disabler 72 allows for the implementation of DC redundancy for the memory array 62. According to one embodiment, the disabler 72 is operable to address and disable leaky memory array columns 30 in the memory array 62. Thus, for example, if a particular memory array column 30 is leaking more than a specified threshold leakage current, the disabler 72 places the leaky memory array column 30 into the standby mode by forcing the mode signal 38 to the appropriate level. The leaky memory array column 30, which is then limited by the corresponding column current limiting transistor 34 to an acceptable leakage current, may then be replaced by a redundant memory array column 30.

In accordance with one embodiment, the disabler 72 may comprise a fuse bank for addressing a leaky memory array column 30 and logic circuitry for disabling the detected leaky memory array column 30 by providing the appropriate mode signal 38 to the column current limiting transistor 34 for the leaky memory array column 30.

Thus, a leaky memory array column 30 may exist in the memory array 62 without increasing the leakage current of other memory array columns 30 in the memory array 62. Memory cells 10 with excessive leakage current or gate to diffusion shorts may be prevented from contributing to the overall power dissipation for a memory array 62.

Although the present invention has been described with several embodiments, various changes and modifications may be suggested to one skilled in the art. It is intended that the present invention encompass such changes and modifications as fall within the scope of the appended claims.

What is claimed is:

1. A method for reducing standby power in a memory array comprising a plurality of transistors, each of the transistors comprising a drain, a source and a gate, the method comprising:

providing a memory array column comprising a plurality of memory cells, each memory cell comprising drive transistors;

coupling a current limiting transistor to the drive transistors;

coupling a mode signal to the current limiting transistor, the mode signal operable to deactivate the current limiting transistor; and deactivating the current limiting transistor when the mode signal indicates that the memory array column is in a standby mode.

2. The method of claim 1, deactivating the current limiting transistor comprising blocking a path from the drive transistors to ground with the current limiting transistor.

3. The method of claim 1, coupling the current limiting transistor to the drive transistors comprising coupling the drain of the current limiting transistor to the sources of the drive transistors.

4. The method of claim 3, further comprising:

coupling the source of the current limiting transistor to ground; and coupling the mode signal to the current limiting transistor comprising coupling the mode signal to the gate of the current limiting transistor.

5. The method of claim 1, the width of the current limiting transistor based on the combined widths of the drive transistors.

6. The method of claim 1, the mode signal further operable to activate the current limiting transistor, the method further comprising activating the current limiting transistor when the mode signal indicates that the memory array column is in an active mode.

7. The method of claim 6, activating the current limiting transistor comprising providing a path from the sources of the drive transistors to ground through the current limiting transistor.

8. The method of claim 6, coupling the current limiting transistor to the drive transistors comprising coupling the drain of the current limiting transistor to the sources of the drive transistors, coupling the mode signal to the current limiting transistor comprising coupling the mode signal to the gate of the current limiting transistor, and the method further comprising coupling the source of the current limiting transistor to ground.

9. The method of claim 1, further comprising coupling a memory array column disabler to the current limiting transistor, the disabler operable to address the memory array column and to disable the memory array column when a leaky status is detected for the memory array column.

10. The method of claim 9, further comprising detecting the leaky status for the memory array column by addressing the memory array column and detecting a leakage current for the memory array column, the leakage current exceeding a specified threshold leakage current.

11. The method of claim 9, further comprising disabling the memory array column by deactivating the current limiting transistor for the memory array column.

12. A reduced standby power memory array comprising a plurality of transistors, each transistor comprising a drain, a source and a gate, the memory array comprising:

a memory cell comprising drive transistors; and a current limiting transistor coupled to the drive transistors, the current limiting transistor operable to receive a mode signal, the mode signal operable to deactivate the current limiting transistor when the cell is in a standby mode.

13. The memory array of claim 12, further comprising a current mirror coupled to the current limiting transistor, the current mirror operable to regulate the current through the current limiting transistor.

14. The memory array of claim 12, the width of the current limiting transistor based on the combined widths of the drive transistors.

15. The memory array of claim 12, the drain of the current limiting transistor coupled to the sources of the drive transistors, the gate of the current limiting transistor operable to receive the mode signal, and the source of the current limiting transistor coupled to ground.

16. The memory array of claim 12, the mode signal further operable to activate the current limiting transistor when the cell is in an active mode.

17. The memory array of claim 16, the current limiting transistor operable to block a path from the sources of the drive transistors to ground when the current limiting transistor is deactivated, and the current limiting transistor operable to provide a path from the sources of the drive transistors to ground when the current limiting transistor is activated.

18. A reduced standby power memory array comprising a plurality of transistors, each transistor comprising a drain, a source and a gate, the memory array comprising:

a plurality of memory array columns, each memory array column comprising a plurality of memory cells, each memory cell comprising drive transistors; and a plurality of column current limiting transistors, each column current limiting transistor coupled to the drive transistors of a corresponding memory array column, each column current limiting transistor operable to receive one of a plurality of column mode signals, each column mode signal operable to deactivate the associated column current limiting transistor when the corresponding memory array column is in a standby mode.

19. The memory array of claim 18, each column mode signal further operable to activate the associated column current limiting transistor when the memory array column is in an active mode.

20. The memory array of claim 18, further comprising an array current limiting transistor for the memory array, the array current limiting transistor coupled to the column current limiting transistors and operable to receive an array mode signal, the array mode signal operable to deactivate the array current limiting transistor when the memory array is in a standby mode.

21. The memory array of claim 18, the width of each column current limiting transistor based on the combined widths of the drive transistors of the corresponding memory array column.

22. The memory array of claim 18, further comprising a clamp coupled to the column current limiting transistors, the claim operable to regulate current through the memory array.

23. The memory array of claim 22, the clamp comprising a clamp transistor, the drain of the clamp transistor coupled to the sources of the column current limiting transistors, the gate of the clamp transistor coupled to the sources of the column current limiting transistors, and the gate of the clamp transistor coupled to ground.

24. The memory array of claim 18, further comprising a memory array column disabler coupled to the column current limiting transistors of the memory array columns, the disabler operable to address a leaky memory array column and to disable the leaky memory array column.

25. The memory array of claim 24, the leaky memory array column having an associated leakage current exceeding a specified threshold leakage current.

26. The memory array of claim 24, the disabler operable to disable the leaky memory array column by deactivating the associated column current limiting transistor for the leaky memory array column.

27. The memory array of claim 24, the disabler comprising a fuse bank operable to address the leaky memory array column and logic circuitry operable to disable the leaky memory array column.

* * * * *